(12) United States Patent
Gaddi et al.

(10) Patent No.: US 9,076,808 B2
(45) Date of Patent: Jul. 7, 2015

(54) RF MEMS ISOLATION, SERIES AND SHUNT DVC, AND SMALL MEMS

(75) Inventors: Roberto Gaddi, S-Hertogenbosch (NL); Richard L. Knipe, McKinney, TX (US); Robertus Petrus Van Kampen, S-Hertogenbosch (NL); Anartz Unamuno, Dresden (DE)

(73) Assignee: CAVENDISH KINETICS, INC., San Jose, CA (US)

( * ) Notice: Subject to any disclaimer, the term of this patent is extended or adjusted under 35 U.S.C. 154(b) by 0 days.

(21) Appl. No.: 14/240,677

(22) PCT Filed: Aug. 31, 2012

(86) PCT No.: PCT/US2012/053481
§ 371 (c)(1),
(2), (4) Date: Apr. 18, 2014

(87) PCT Pub. No.: WO2013/033613
PCT Pub. Date: Mar. 7, 2013

(65) Prior Publication Data
US 2014/0300404 A1    Oct. 9, 2014

Related U.S. Application Data

(60) Provisional application No. 61/530,677, filed on Sep. 2, 2011.

(51) Int. Cl.
| | | |
|---|---|---|
| H03H 9/00 | (2006.01) |
| H01L 49/02 | (2006.01) |
| H01G 5/18 | (2006.01) |
| H01G 5/38 | (2006.01) |
| H01G 5/40 | (2006.01) |
| H01H 59/00 | (2006.01) |
| H03K 17/16 | (2006.01) |
| H03K 17/687 | (2006.01) |

(52) U.S. Cl.
CPC .............. *H01L 28/60* (2013.01); *H01G 5/18* (2013.01); *H01G 5/38* (2013.01); *H01G 5/40* (2013.01); *H01H 59/0009* (2013.01); *H03K 17/162* (2013.01); *H03K 17/6872* (2013.01); *H03K 2217/0009* (2013.01); *H03K 2217/0036* (2013.01); *H03K 2217/009* (2013.01)

(58) Field of Classification Search
CPC ........................................... H03H 2009/02496
See application file for complete search history.

(56) References Cited

U.S. PATENT DOCUMENTS

2011/0043960 A1*  2/2011  Ikehashi .................. 361/207

FOREIGN PATENT DOCUMENTS

| EP | 1986319 A2 | 10/2008 |
| WO | 2010054244 A2 | 5/2010 |
| WO | 2011047356 A1 | 4/2011 |

OTHER PUBLICATIONS

International Search Report and Written Opinion issued in PCT/US2012/053481, mailed Apr. 24, 2013.

*Primary Examiner* — Daniel Puentes
(74) *Attorney, Agent, or Firm* — Patterson & Sheridan, LLP

(57) ABSTRACT

The present invention generally relates to an architecture for isolating an RF MEMS device from a substrate and driving circuit, series and shunt DVC die architectures, and smaller MEMS arrays for high frequency communications. The semiconductor device has one or more cells with a plurality of MEMS devices therein. The MEMS device operates by applying an electrical bias to either a pull-up electrode or a pull-down electrode to move a switching element of the MEMS device between a first position spaced a first distance from an RF electrode and a second position spaced a second distance different than the first distance from the RF electrode. The pull-up and/or pull-off electrode may be coupled to a resistor to isolate the MEMS device from the substrate.

20 Claims, 24 Drawing Sheets

RF MEMS ISOLATION, SERIES AND SHUNT DVC, AND SMALL MEMS

BACKGROUND OF THE INVENTION

1. Field of the Invention

Embodiments of the present invention generally relate to an architecture for isolating an RF micro-electromechanical system (MEMS) device from a substrate and driving circuit, series and shunt digital variable capacitors (DVC) die architectures, and smaller MEMS arrays for high frequency communications.

2. Description of the Related Art

Variable capacitors can be used to optimize the performance of RF circuits like antennas and RF-filters. Using standard complementary metal oxide semiconductor (CMOS) batch processing to fabricate these devices can ensure a high volume production and a low cost of these devices. However, integrating passive RF devices on silicon poses some challenges due to coupling of the RF signal to the lossy silicon substrate and monolithic CMOS active circuits. This can introduce both electric and magnetic losses which will reduce the effective Q of these capacitors and noise/spurious disturbs, which all will negatively impact the overall system performance.

Therefore, there is a need in the art for variable capacitors integrated with CMOS circuits on the same chip.

SUMMARY OF THE INVENTION

The present invention generally relates to an architecture for isolating an RF MEMS device from a substrate and driving circuit, series and shunt DVC die architectures, and smaller MEMS arrays for high frequency communications. The semiconductor device has one or more cells with a plurality of MEMS devices therein. The MEMS device operates by applying an electrical bias to either a pull-up electrode or a pull-down electrode to move a switching element of the MEMS device between a first position spaced a first distance from an RF electrode and a second position spaced a second distance different than the first distance from the RF electrode. The pull-up and/or pull-off electrode may be coupled to a resistor to isolate the MEMS device from the substrate.

In one embodiment, a semiconductor device includes a substrate; one or more cells disposed over the substrate; one or more MEMS devices disposed in each cell; and one or more resistors disposed between the substrate and the one or more cells.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

This invention provides a method to include MEMS RF variable capacitor devices integrated with CMOS circuits on the same chip. Special measures are taken to isolate the RF switch from the CMOS control circuit and the silicon substrate to ensure a good RF performance.

The present invention generally relates to an architecture for isolating an RF MEMS device from a substrate and driving circuit, series and shunt DVC die architectures, and smaller MEMS arrays for high frequency communications. The semiconductor device has one or more cells with a plurality of MEMS devices therein. The MEMS device operates by applying an electrical bias to either a pull-up electrode or a pull-down electrode to move a switching element of the MEMS device between a first position spaced a first distance from an RF electrode and a second position spaced a second distance different than the first distance from the RF electrode. The pull-up and/or pull-off electrode may be coupled to a resistor to isolate the MEMS device from the substrate.

Figure 1:
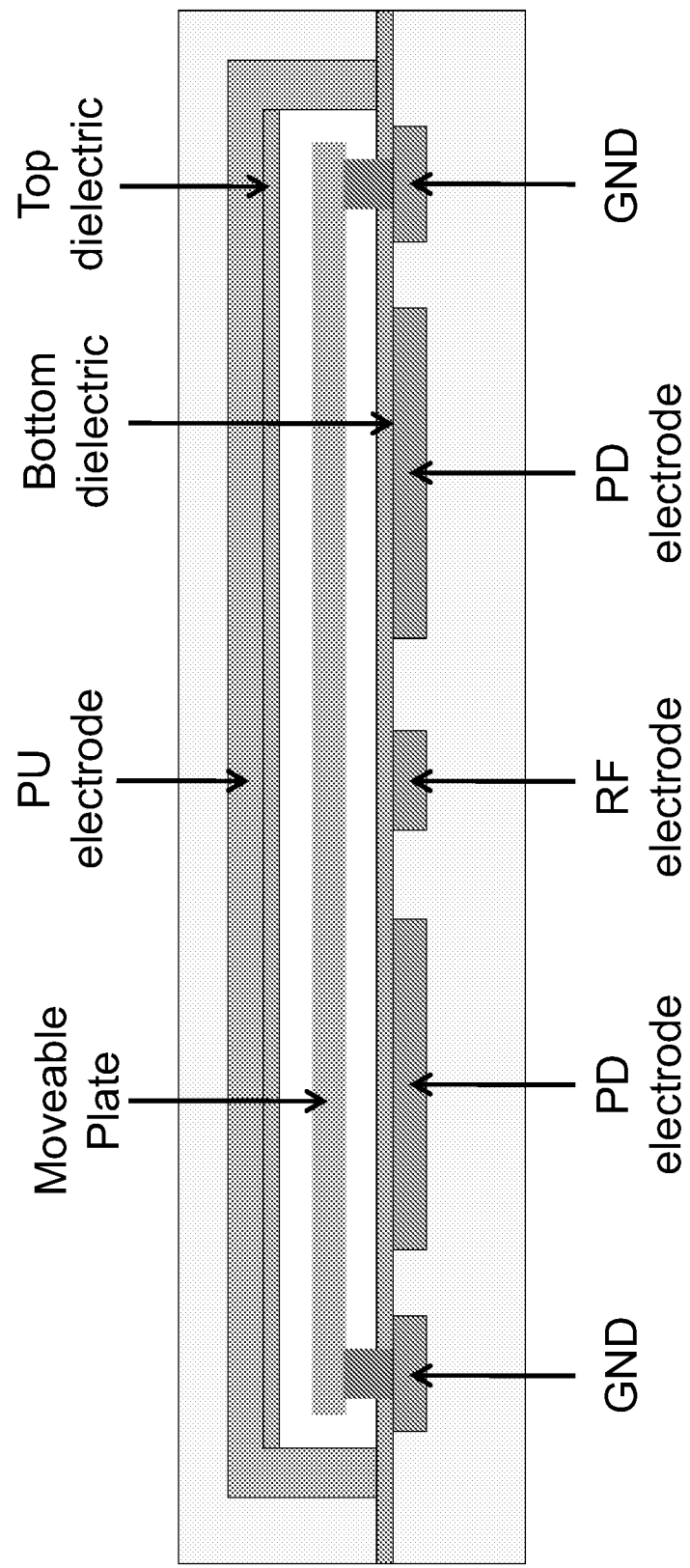
FIG. 1 is a cross-section view of the MEMS variable capacitor device according to one embodiment.

A cross-section of the MEMS variable capacitor device is shown in FIG. 1. It consists of a moveable plate which is connected to ground (GND) and enclosed in a sealed cavity. It has a certain capacitance from the RF-electrode to the moveable plate (GND) which varies with the plate position. The device has a pull-down (PD) control electrode which is used to pull the plate down to the bottom via electrostatic forces (See FIG. 2) and results in an increase of the capacitance to Cmax from the RF-electrode to GND. The device also has a pull-up electrode (PU) which is used to pull the plate up to the cavity roof (See FIG. 3) and results in a decrease of the capacitance to Cmin from the RF-electrode to GND.

Figure 4:
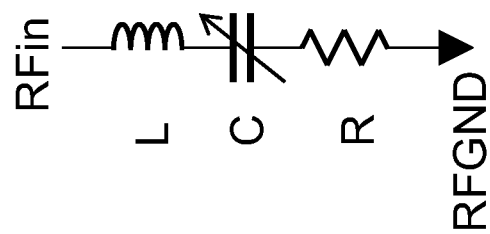
FIG. 4 shows an equivalent circuit model of the variable MEMS capacitor.

In a very simplistic model approach, generally accurate only within a limited target frequency bandwidth, the variable capacitor between RF and GND can be represented by a series RLC network as shown in FIG. 4. The variable capacitor C represents the intrinsic device. The inductor L represents the access inductance into the switch and resistor R represents the losses in the switch.

Figure 5:
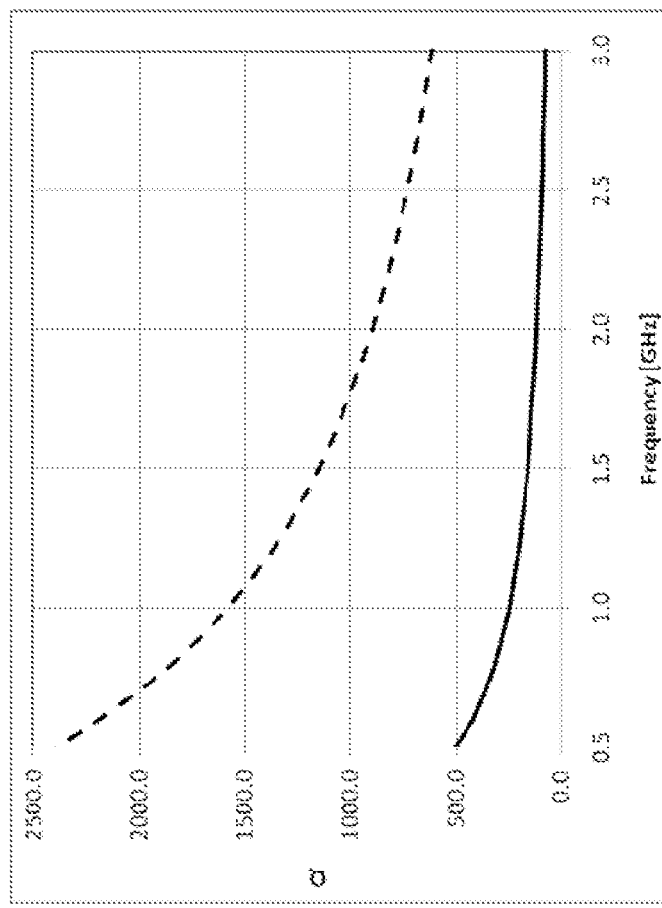
FIG. 5 shows Q vs. frequency for a variable capacitor device in the Cmax-state (solid line) and Cmin-state (dashed line).

The access inductance typically only plays a role at high frequencies and the effect thereof in the frequency band of interest can be minimized by careful design of the switch topology. The losses in the switch represented by R result in a quality factor Q of the switch $Q=1/\omega RC$. Such a definition of R is also known as Equivalent Series Resistance (ESR). Typical desired values for Q are >100. FIG. 5 shows a typical Q vs. frequency response of a variable capacitor device in the Cmax-state (dashed line) and in the Cmin-state (solid line). Because the capacitor values in the Cmax-state are higher than in the Cmin-state, the Q factors in the Cmax-state are typically lower than in the Cmin-state. This is despite of the fact that the ESR (R) will not be perfectly constant as the device state changes from Cmin to Cmax.

Figure 6:
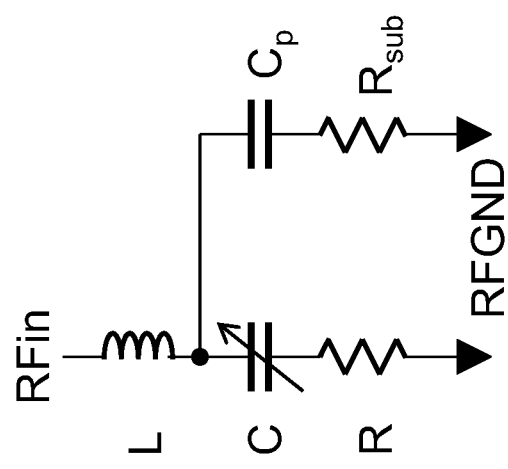
FIG. 6 shows an equivalent circuit model of the variable MEMS capacitor including losses to the substrate.

When integrating the MEMS switch on a standard CMOS silicon substrate, there will be additional coupling of the RF-electrode to the silicon substrate. FIG. 6 shows the equivalent circuit model with the parallel path to the substrate indicated by Cp and Rsub. The additional losses caused by this parallel path can cause the effective Q of the switch to drop to very low numbers. This will have a large negative impact on the performance of the antenna or RF-filter and should be avoided.

Figure 7:
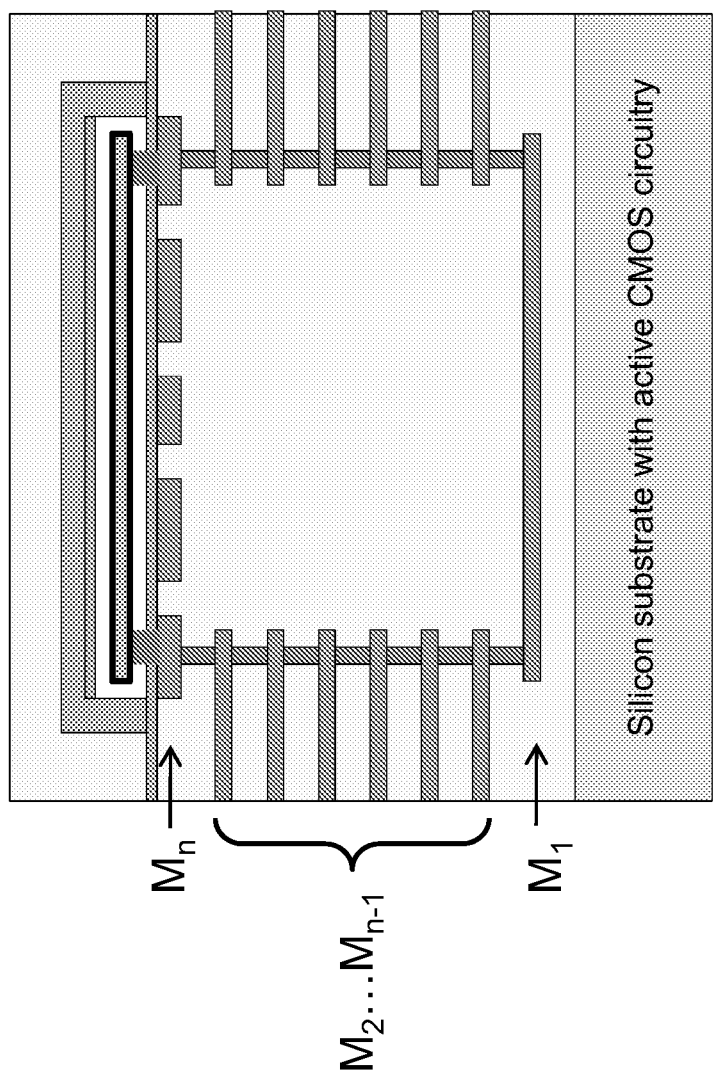
FIG. 7 illustrates a cross-section view of variable capacitor MEMS device with ground-shield.

To avoid the drop in Q the MEMS variable capacitor device should be shielded from the substrate by adding a ground-shield underneath the MEMS device, as shown schematically in FIG. 7. The ground shield is implemented in the first metallization layer of the chip ($M_1$). Additional metallization layers $M_2 \ldots M_{n-1}$ are present to create a large distance between the MEMS RF electrode layer $M_n$. Furthermore, the additional metallization layers $M_2 \ldots M_{n-1}$ and tightly spaced connecting vias in between can be used to implement "walls" at both sides of the capacitor, generating in fact a shielding box capable of isolating also sideways from both substrate and monolithic active CMOS circuitry.

Figure 8:
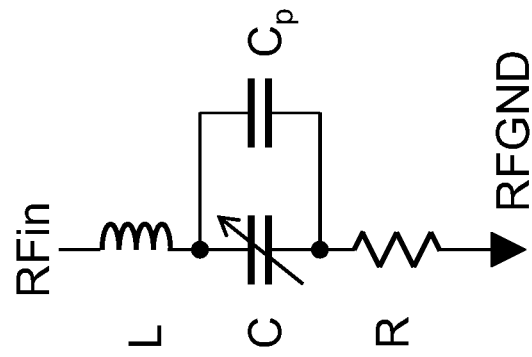
FIG. 8 illustrates an equivalent circuit model of the variable capacitor device with ground shield.

The equivalent circuit of the MEMS variable capacitance switch with the ground shield is shown in FIG. 8. The parasitic capacitance of the RF-electrode to GND is in parallel with the variable capacitance and will thus increase the total capacitance value a bit, but it will not cause the Q to drop to low values.

The ground shield can be implemented at any metallization level $M_1 \ldots M_{n-1}$, so that some active circuitry with metal routing can be placed directly underneath the MEMS variable capacitor device if desired. However, to minimize the increase in the total capacitance, a large distance between the ground-shield and the DVC device may be desired. Typical values of this distance ranges from 5 um to 20 um. Using the ground shield under the MEMS device thus allows monolithic integration of the variable capacitor on the same silicon chip that contains the control circuit while maintaining the required RF performance.

Figure 9:
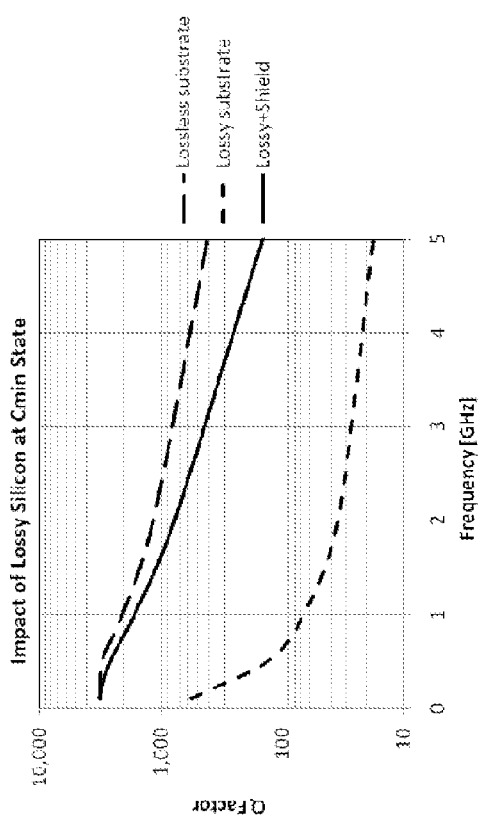
FIGS. 9 and 10 show the impact of silicon losses shown as Q factor of a variable capacitor at either Cmin (FIG. 9) or Cmax (FIG. 10).
Figure 10:
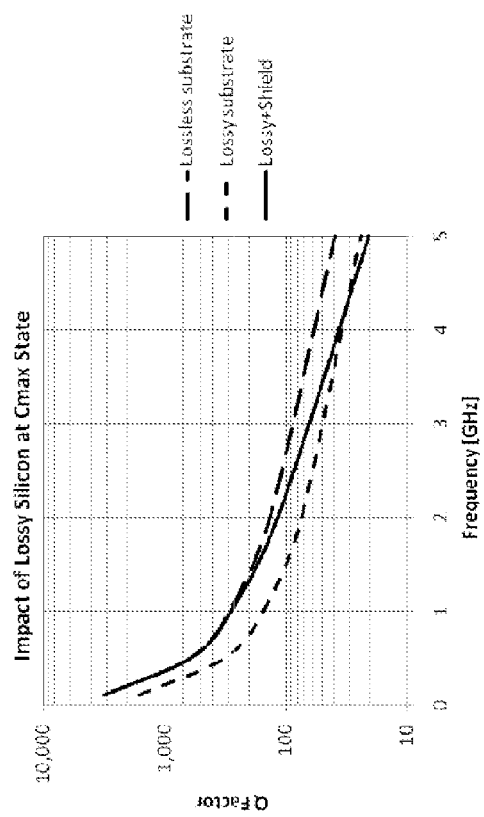

An example implementation of the ground shield is analyzed using EDA simulation tools and the result is shown in FIGS. 9 and 10. The largest impact of silicon losses happens when the capacitor is at its lowest value. Looking at the simple equivalent model in FIG. 6, the intrinsic capacitor presents its highest impedance when at its minimum value, therefore allowing most RF currents to flow in the substrate parallel path. On the other end, when the capacitor is at its highest value state, most RF current flows in the intrinsic capacitor itself and the relative impact of silicon losses is less. In both cases, introducing the ground shield recovers the Q factor value almost completely to the ideal high resistivity Silicon reference case, which has no losses in the substrate.

Figure 11:
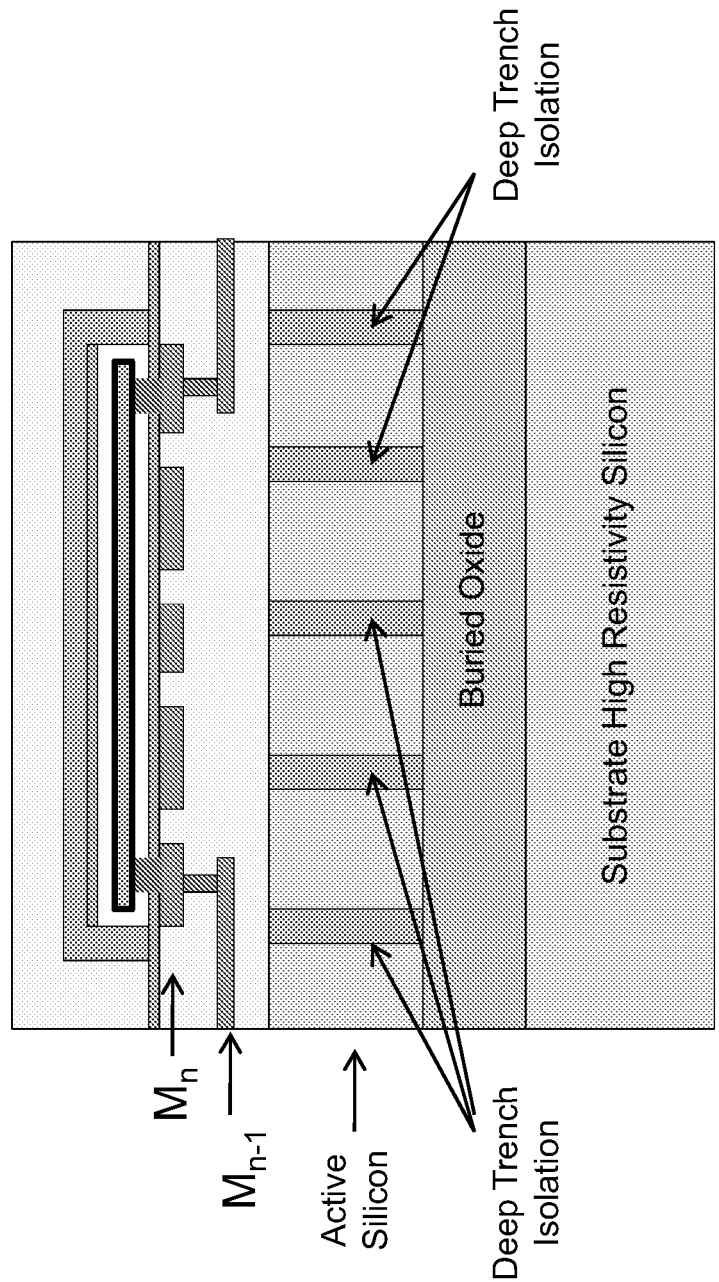
FIG. 11 shows a possible implementation on SOI according to one embodiment.

Integration of the MEMS switch on alternative technology substrates can provide sufficiently low losses (high Q factors) without the need of implementing a ground shield. This has advantages when very low minimum capacitance and/or high tuning ratios are required. Such alternative substrates include Silicon-On-Insulator (SOI) with High Resistivity substrate, Silicon-On-Sapphire (SOS), Silicon-On-Nothing (SON) or equivalent. In FIG. 11, a possible implementation is shown on SOI. The active silicon layer will include deep trench isolation patterns in order to isolate pillars (staggered or aligned) of active silicon. This is a way to reduce the losses due to capacitive coupling to the active silicon from the MEMS: isolation trenches will break the current paths within the active silicon, minimizing overall losses and maintaining the Q across the full capacitance range. Using deep trench isolation patterns in the active SOI layer under the MEMS device thus allows monolithic integration of the variable capacitor on the same SOI silicon chip that contains the control circuit while maintaining the required RF performance.

Figure 12:
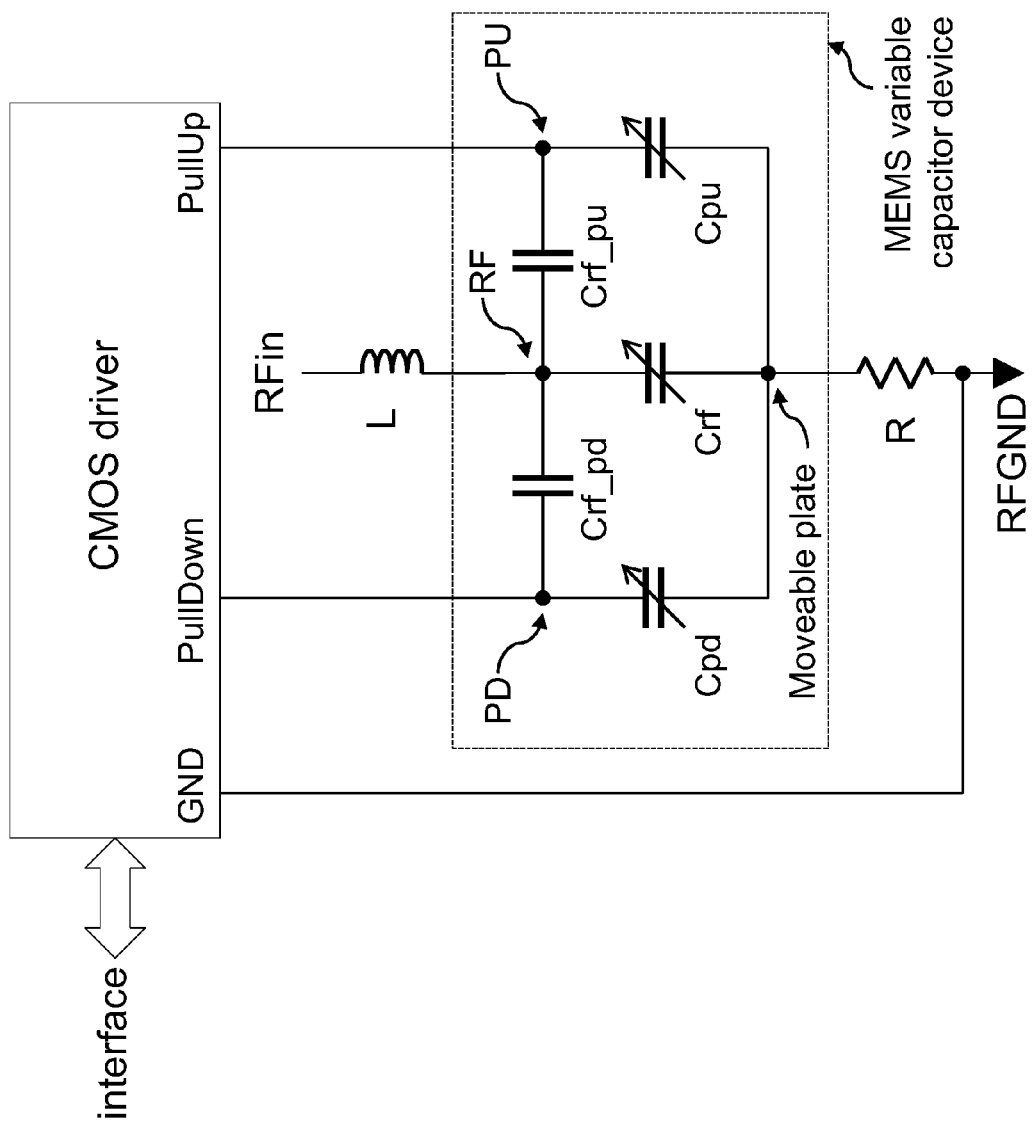
FIG. 12 illustrates an equivalent circuit model of the variable capacitor device including CMOS driver.

Another aspect to enable the co-integration of the MEMS RF device and the CMOS control circuit is a way to de-couple the MEMS RF device from the control circuit. A more detailed circuit schematic of the MEMS variable capacitor device including the control electrodes PD and PU and the CMOS driver circuit is shown in FIG. 12. The various nodes of the MEMS variable capacitor device (RF, PU, PD, moveable plate) correspond to the equally named electrodes of FIG. 1.

The CMOS driver circuit will apply appropriate voltages on the PU and PD nodes of the MEMS device to either pull the moveable plate up or down and thereby changing the equivalent capacitance from node RF to GND. Because of parasitic capacitive coupling from the RF electrode to the PD and PU electrode (via Crf_pd and Crf_pu), a part of the RF power actually appears on the PU and PD nodes.

The output impedance of the CMOS driver at the PullDown and PullUp nodes are not ideal low-ohmic impedances at RF frequencies since the CMOS is located in the bulk of the silicon. Therefore, the RF power that appears on the PD and PU nodes of the MEMS device is lost in the lossy silicon which will negatively impact the effective Q of the device. At the same time noise generated in the output of the CMOS driver at the PullDown and PullUp nodes can couple directly to the PD and PU nodes and to the RF node which will have a negative impact on the noise performance of the RF circuit.

Figure 13:
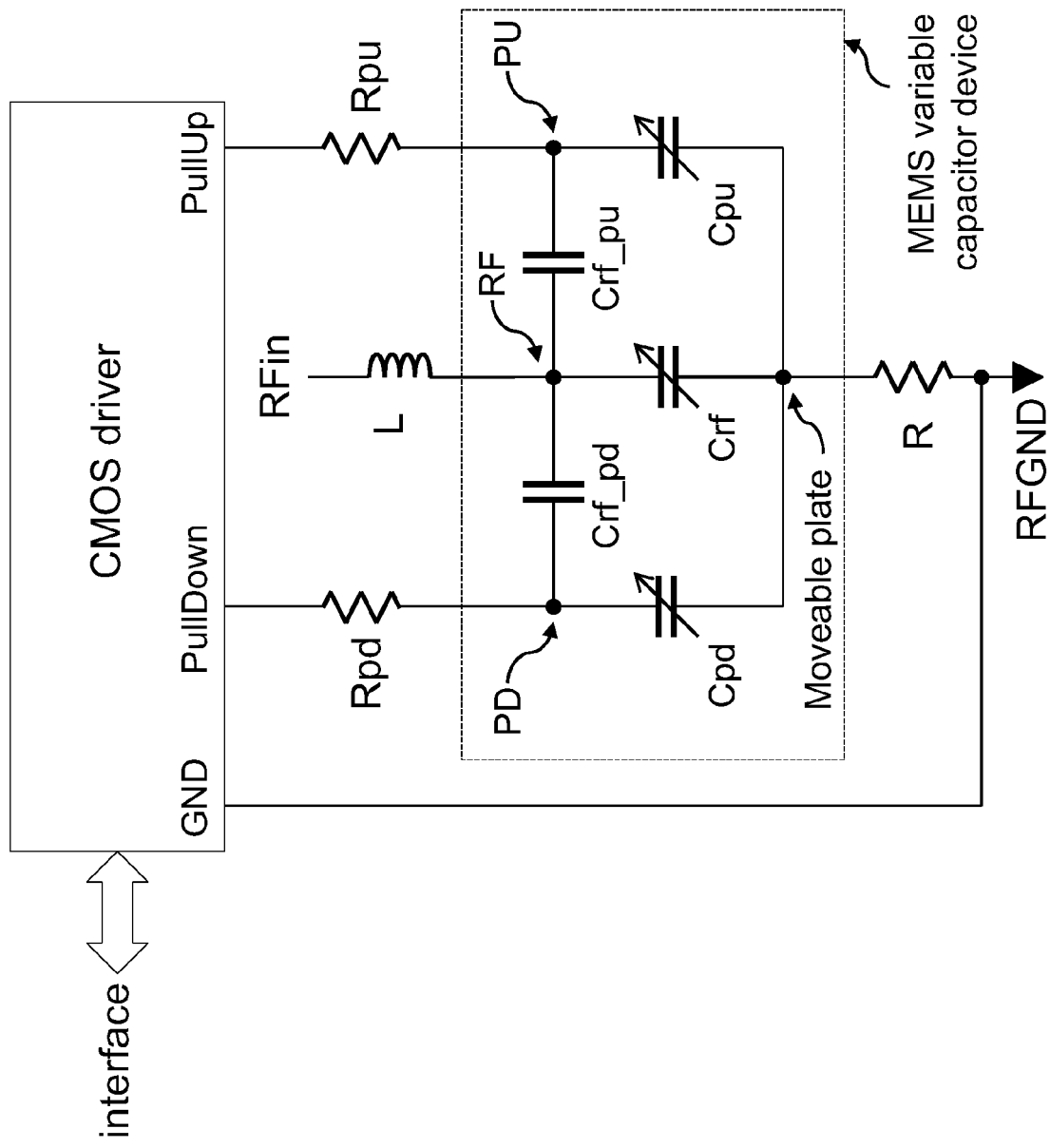
FIG. 13 illustrates an equivalent circuit model of the variable capacitor device including CMOS driver and isolation resistors.

To avoid these negative effects, the MEMS PD and PU electrodes can be isolated from the CMOS driving nodes PullDown and PullUp of the driver circuit using high-resistance poly-resistors Rpu and Rpd as shown in FIG. 13. These isolation resistors together with the MEMS device capacitors Cpd, Crf, Cpu, Crf_pd and Crf_pu implement a filter to isolate the RF signals on the PD and PU nodes from the CMOS driving nodes PullDown and PullUp. RF power appearing on nodes PD and PU of the MEMS variable capacitor device will now couple to the moveable plate via capacitors Cpd and Cpu and will then flow to RFGND. There is no negative impact on the Q of the device.

Figure 14:
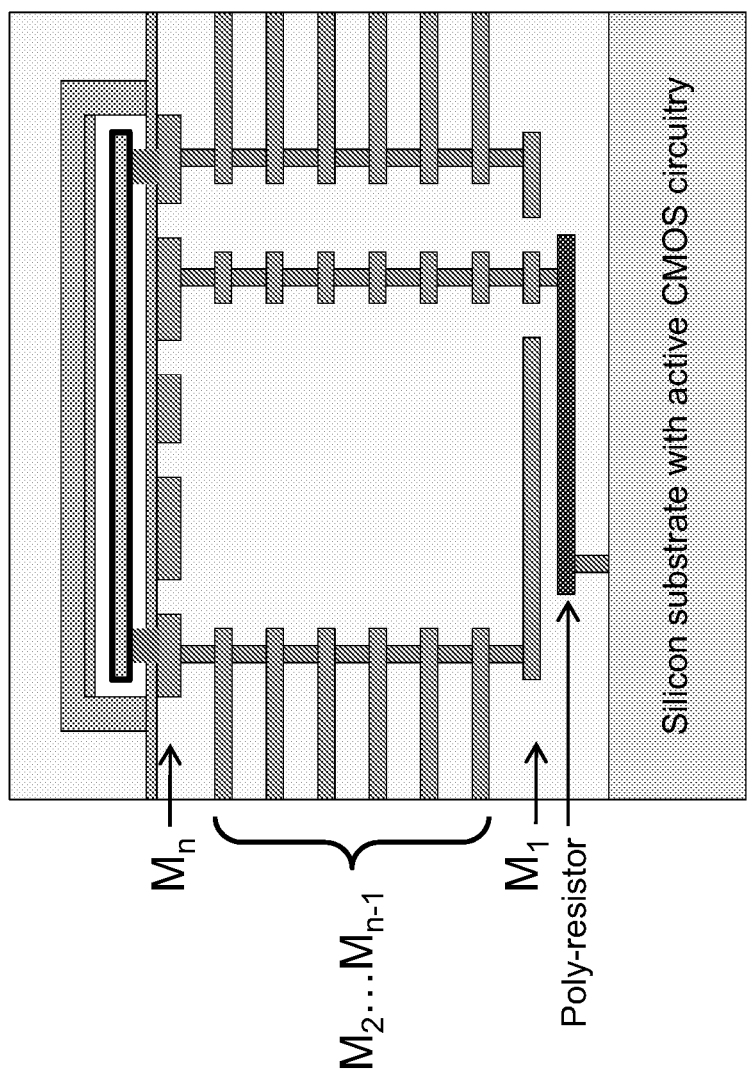
FIG. 14 illustrates a cross-section view of MEMS variable capacitor with isolation poly-resistor under the ground shield.

The value for these isolation resistors Rpd and Rpu will depend on the intended RF bands of application and on the capacitance size. For standard communication bands spanning the 0.7 GHz to 3.5 GHz, typical values range from 100 k$\Omega$ to 10M$\Omega$. Using a standard available sheet resistance of 1 to 2 k$\Omega$/square for hi-resistivity non-salicided poly in many CMOS processes available nowadays these resistor ranges can be easily implemented. The isolation resistors themselves can be located underneath the ground-shield directly underneath the MEMS variable capacitor devices as shown in FIG. 14.

In regards to series and shunt DVC die architectures, several shortcomings of existing solutions for implementing a digitally controlled variable capacitor to be used in high frequency communications are addressed such as: having low series resistance and inductance added by the copper line on the application circuit RF board connecting to the digital variable capacitor foot-print; implementing both a shunt and a series configuration variable capacitor from the same base MEMS technology; and having a flexible architecture that allows different size capacitances to be implemented in a modular way with a shared control CMOS section.

FIG. 1 shows a schematic cross section of a single MEMS device implementing a 2 valued capacitor. The capacitance is measured between the RF electrode and the moveable plate (B electrode). The pull down (PD) and pull up (PU) electrodes are providing electrostatic actuation for defining the capacitance value of the device.

Figure 2:
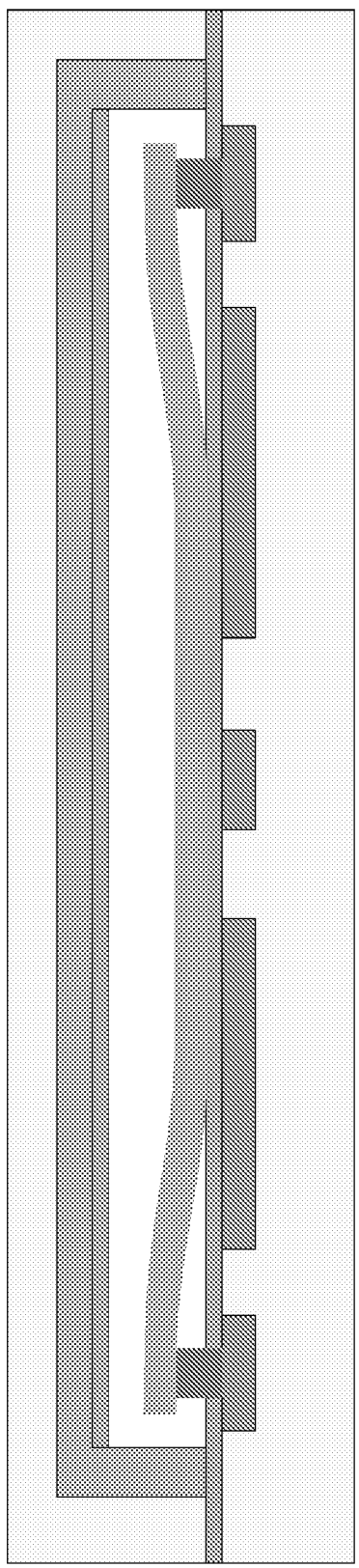
FIGS. 2 and 3 are cross-sectional views of the MEMS variable capacitor in the Cmax-state (FIG. 2) and Cmin-state (FIG. 3).
Figure 3:
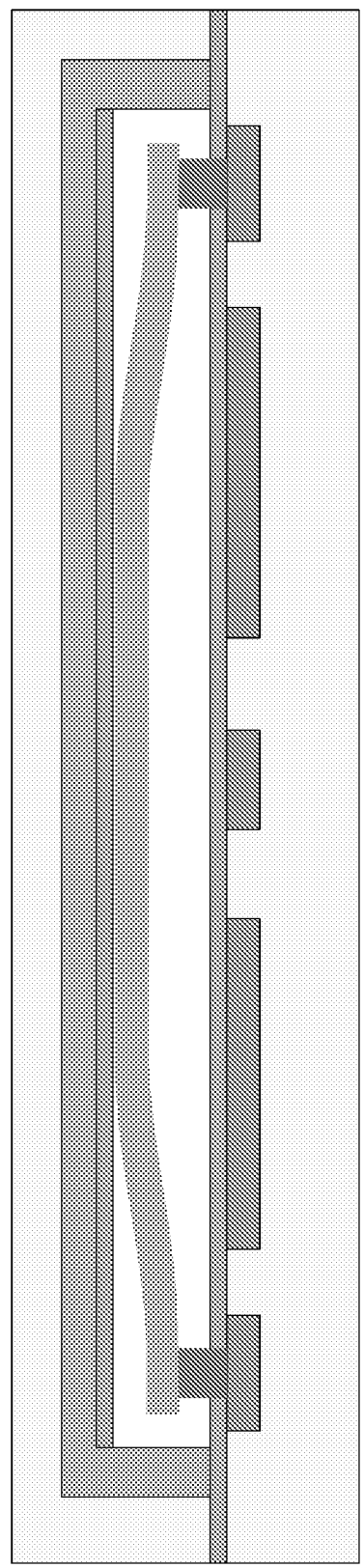

FIGS. 2 and 3 show the MEMS device in a maximum capacitance state (FIG. 16) following application of voltage to the PD electrode, and in a minimum capacitance state (FIG. 3), following application of voltage to the PU electrode. The size of the MEMS device is defined by its maximum capacitance. It is clear that the width of the RF electrode will be directly proportional to the MEMS device size, so a wider RF electrode will result in a larger MEMS device size. Typical values for MEMS device size are in the 2-20 fF range.

Figure 15:
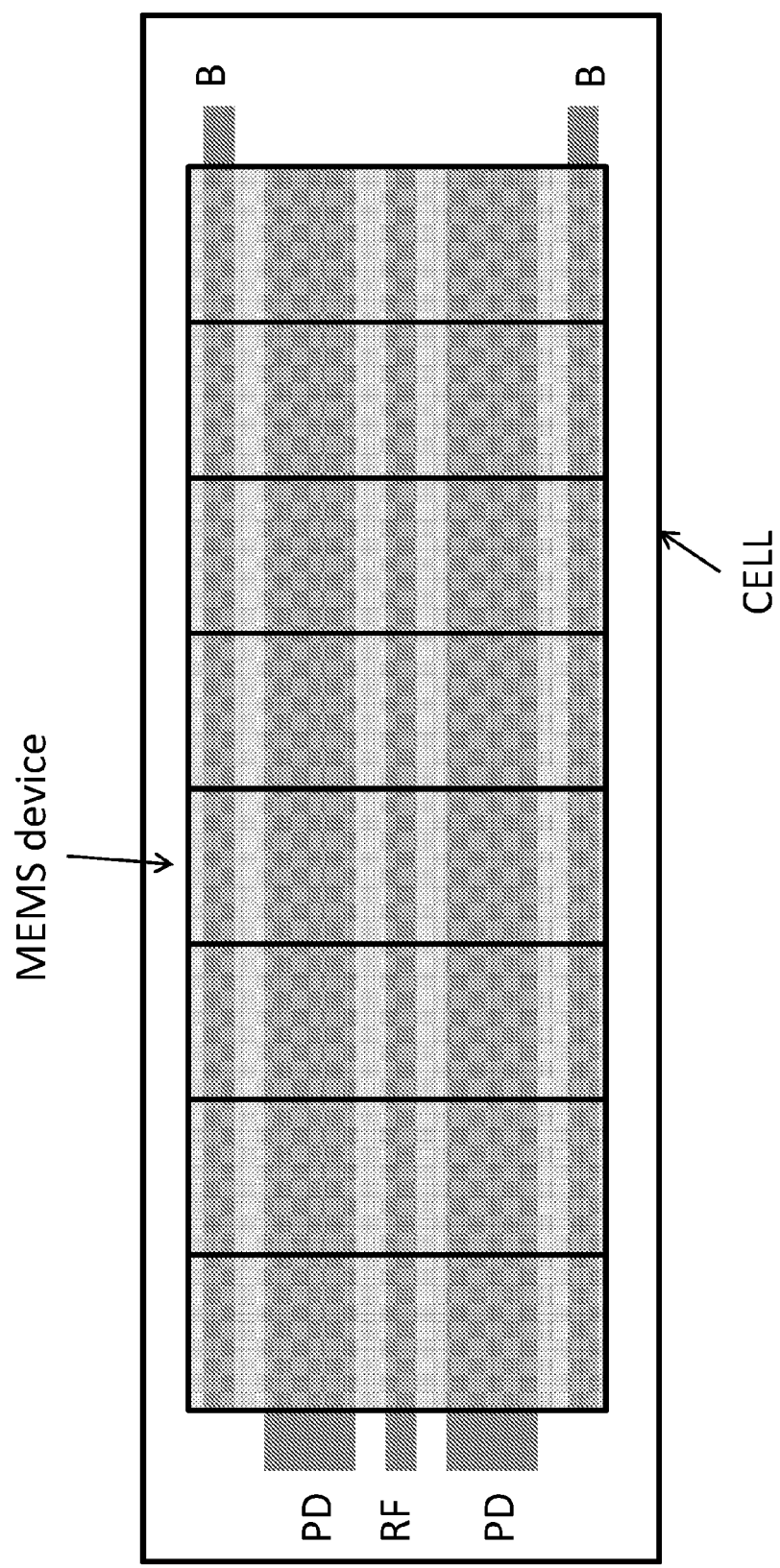
FIG. 15 is an illustration of a cell containing multiple MEMS devices according to one embodiment.

FIG. 15 shows a top drawing of a cell made of 8 MEMS devices. The top view of the MEMS device moveable plate is just shown as a box while the actual design will have features which are not scope of this disclosure. Adjacent MEMS devices can be either separate or linked. In this implementation all MEMS devices are the same size, since the RF electrode running perpendicular to them has constant width across the whole cell. This cell has a total capacitance range given by Cmin_cell=Cmin_mems*Nmems and Cmax_cell=Cmax_mems*Nmems. By providing the MEMS device with a very small size, the cell can be designed to target a specific capacitance value (either minimum or maximum) with resolution equal to the MEMS device capacitance. This is a very valuable feature in the design of the digital variable capacitor since appropriate cell grouping together with CMOS control circuit can be used to implement features for improved performance.

In one implementation is the variable capacitor intended to be connected as shunt to ground. This implementation results in a single port device, with a single RF pin and one RF ground (RFGND) and further control 10 and supply pins. The architecture of cells that forms the digital variable capacitor aims at minimizing extra parasitics due to (1) interconnect level in the CMOS back end of line metals that is used to couple cells to bump pads; (2) copper trace that connects the application circuit to the footprint of the die for flip-chip assembly. In the following implementations it will described how both pads arrangements and connection schemes of the constituent cells both come together to minimize such parasitics and lead to optimum performances.

Figure 16:
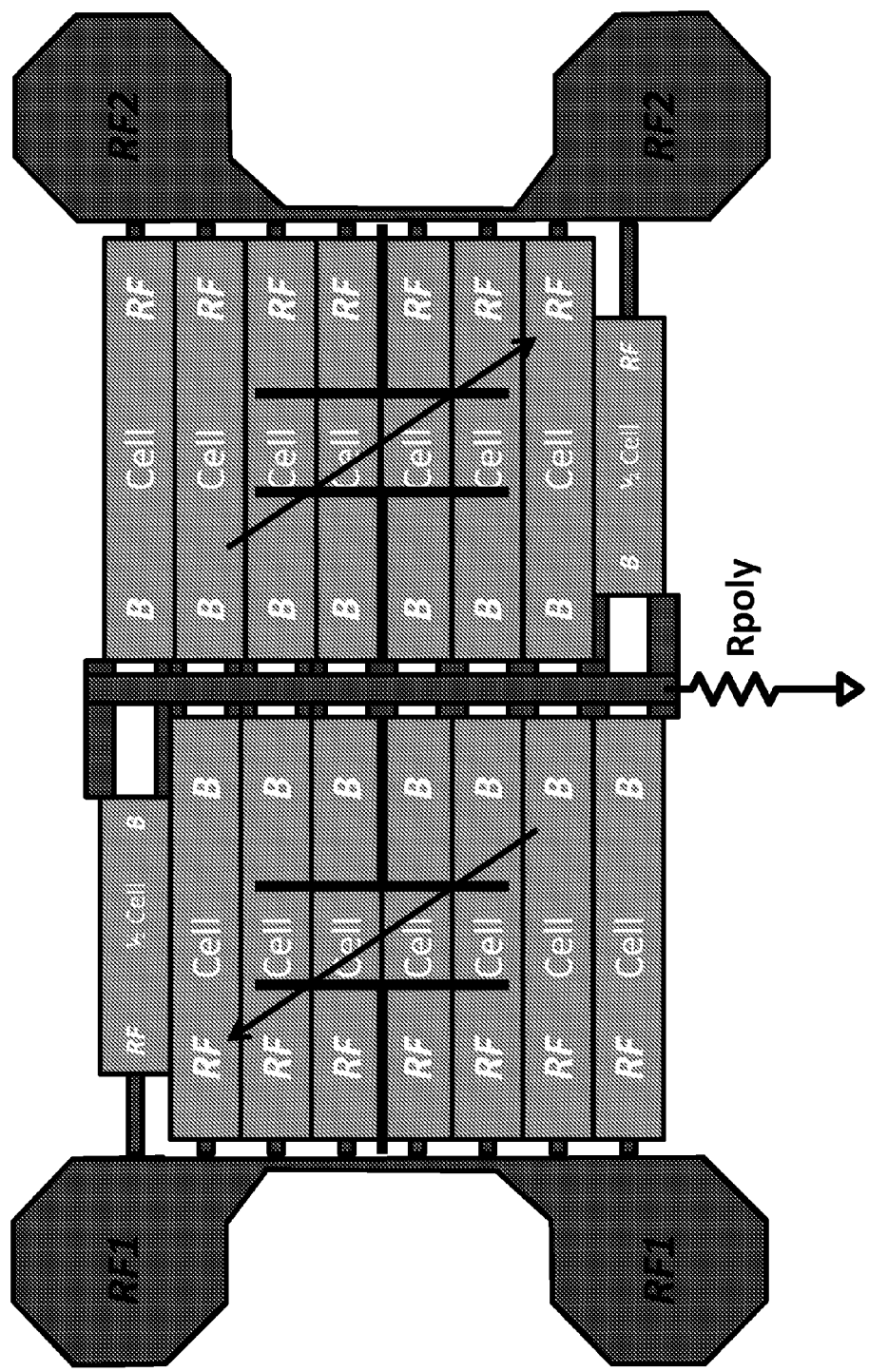
FIG. 16 is a schematic illustration of a series variable capacitor based on back-to-back cell architecture.

FIG. 16 is a schematic description of the implementation of a series variable capacitor based on back-to-back cell architecture. The total capacitance between pins RF1 and RF2 is created by implementing two double sized capacitances in series. The center node is the connection to the movable plate of the MEMS devices in all cells (B electrode). This center node is electrically floating for intended application frequencies (RF). In order to properly operate the MEMS devices with electrostatic actuation, this center node will be DC grounded. A resistor of properly designed value, depending on the intended RF bands of application and on the total capacitor size, is used to DC couple this center "float" electrode to ground. For standard communication bands spanning the 0.7 GHz to 3.5 GHz is such resistor value in the k$\Omega$'s to M$\Omega$'s range.

Figure 17:
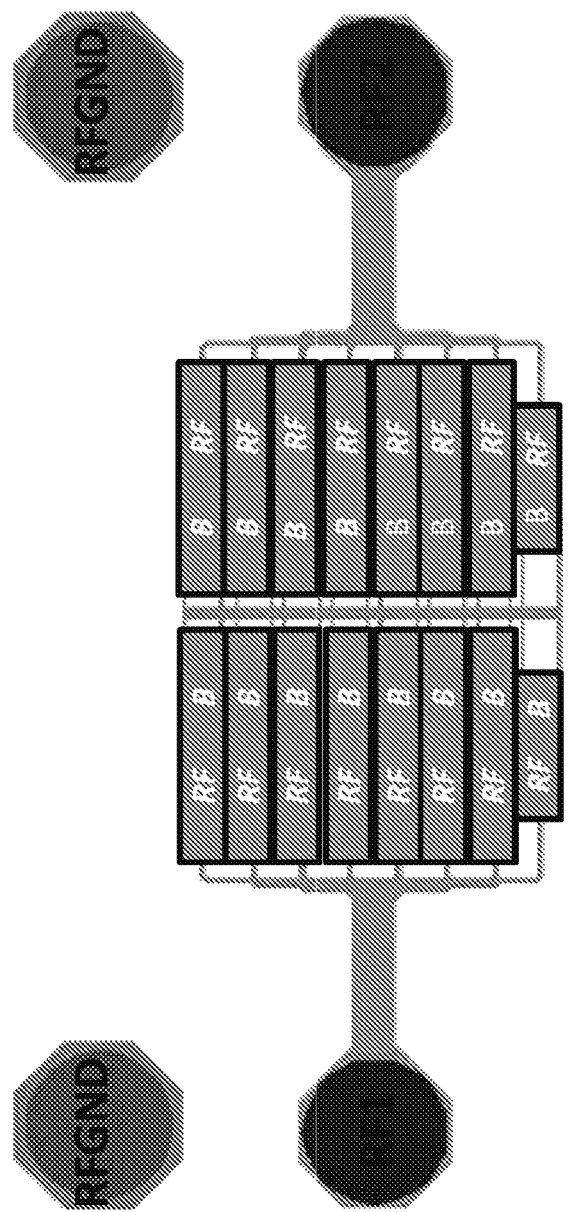
FIG. 17 is a schematic illustration of a back-to-back series capacitance that uses a reduced number of bump pads.

FIG. 17 is an alternative embodiment of the back-to-back series capacitance which uses a reduced number of bump pads. In FIG. 17, the RF ground connection pads are also shown, placed at each side of the series capacitor for providing good access to board level ground planes.

Figure 18:
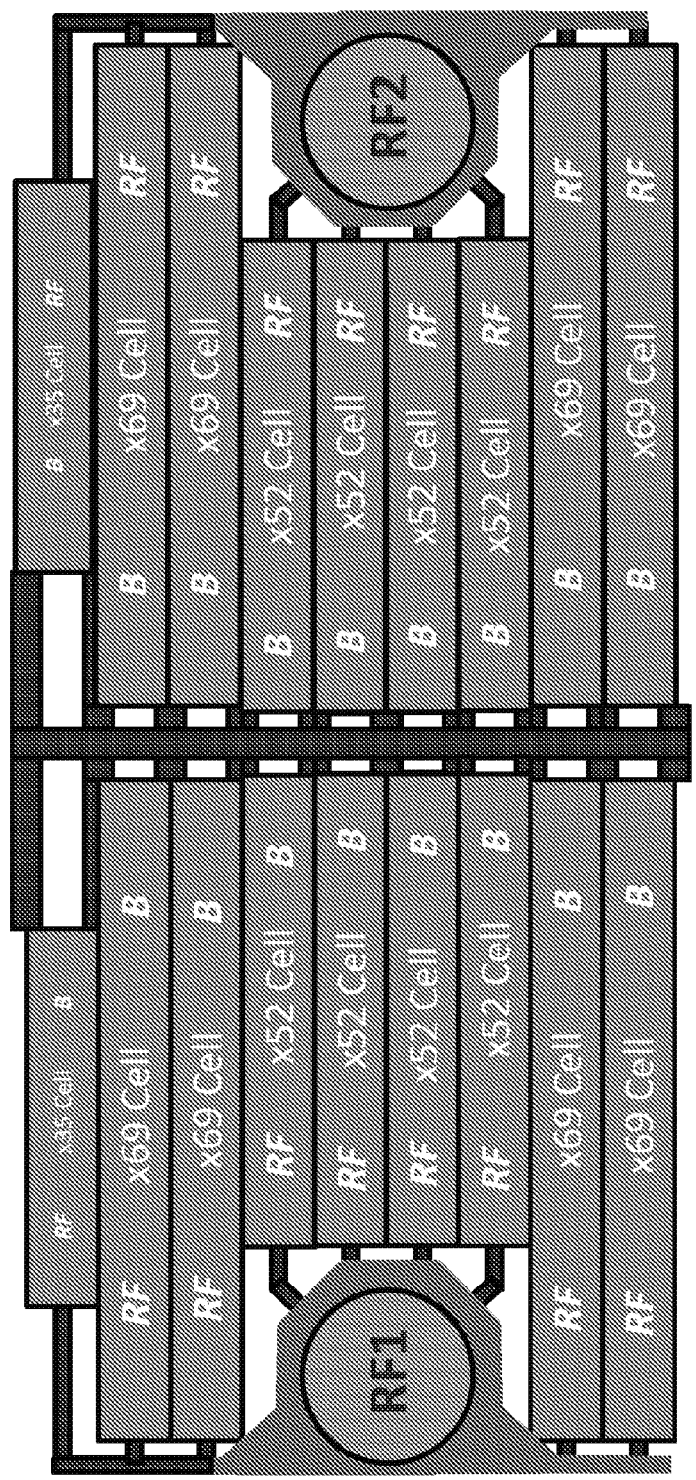
FIG. 18 is a schematic illustration of larger sized series capacitance based on back-to-back architecture.

In FIG. 18, a larger size series capacitance based on the previous back-to-back architecture is shown. Different size cells are used to maximize the area occupation and achieve the maximum capacitance size per given MEMS device size. The combination of cell sizes and cell assignment to bits of the digital control makes sure a constant step size is achieved through the full capacitance range of the digital variable capacitor. This is the 3 bits control assignment description: bit0: 1×35 cell=35 MEMS devices=1×LSB; bit1: 1×69 cell=69 MEMS switches=2×LSB; bit2: 2×69 cells=138 MEMS devices=4×LSB; bit3=4×52 cells+1×69 cell=277 MEMS devices=8×LSB. This shows how the use of small size MEMS capacitive switches appropriately grouped in cells is a key novelty step in generating targeted size digital variable capacitors with excellent RF performance.

Figure 19:
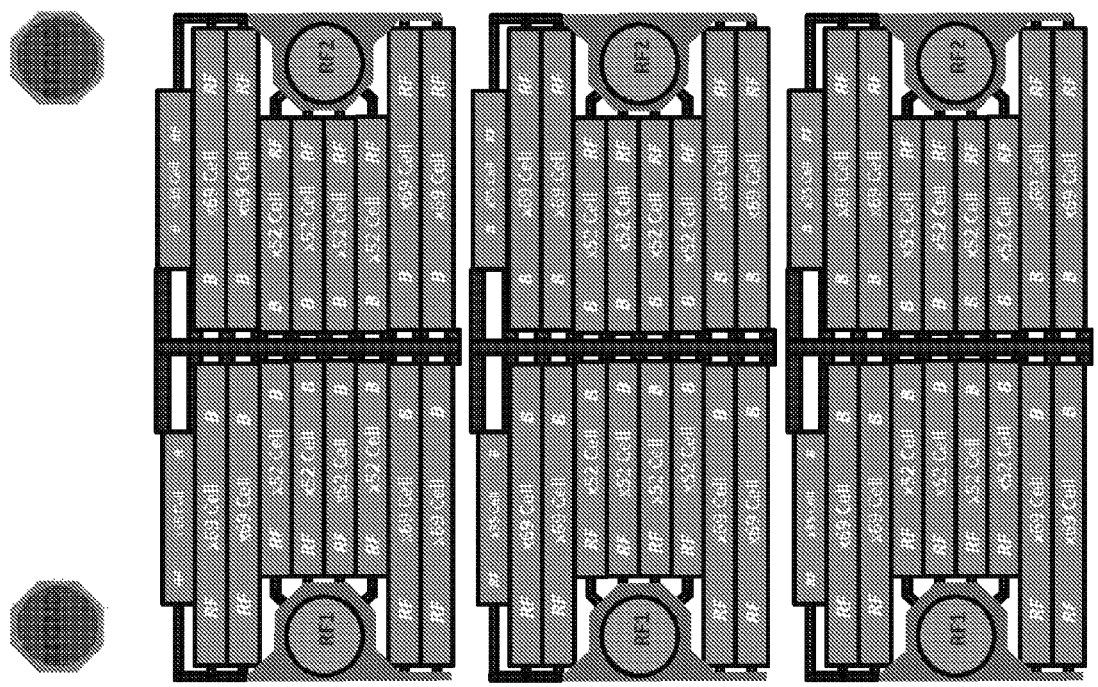
FIG. 19 is a schematic illustration of a scaled up architecture according to one embodiment.

In FIG. 19 a scaled up architecture is shown to demonstrate the implementation of larger total capacitance based on multiple units integrated on the same die. The specific example generates a three times larger capacitance by placing 3 single unit digital capacitances in parallel. The CMOS control circuitry, not shown and intended to be monolithically integrated on the same die, will be shared between all 3 units and will take care of generating the required capacitance values vs. control states in a binary coded fashion.

Figure 20:
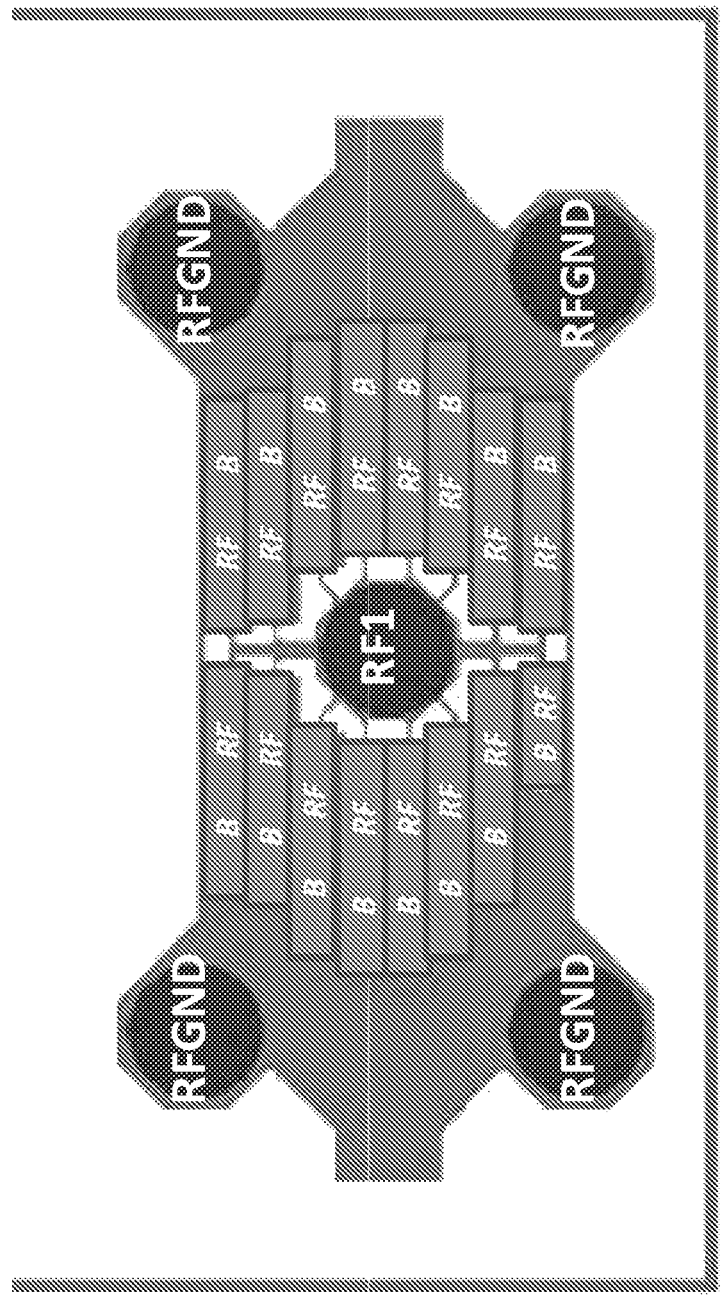
FIG. 20 is a schematic illustration of a shunt DVC.

In FIG. 20, an implementation of a shunt digital variable capacitor is shown. The architecture aims at minimizing series inductance from the CMOS back end interconnects by adopting 4 bump pads for the RFGND pin. The device is placed as close as possible to the edge of the die in order to minimize extra series inductance and resistance from the board level copper lines reaching the bump pads. The top side of the die, not shown, is intended to have monolithically integrated CMOS control circuitry and bump pads.

Figure 21:
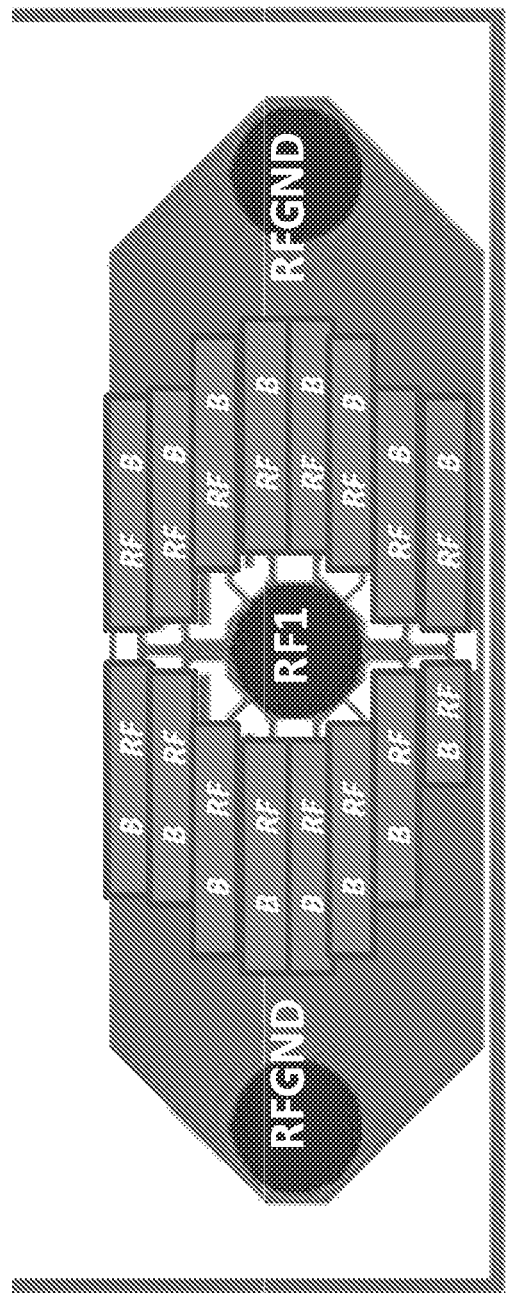
FIG. 21 is a schematic illustration of a shunt DVC according to another embodiment.

An alternative architecture for the shunt digital variable capacitor is shown in FIG. 21. Here only 2 ground bump pads are implemented, generating 3 in-line bumps for GND-RF-GND contacts. The advantage is the ability to place all bump pads very close to the die edge, minimizing further the extra series inductance and resistance of the board level copper lines. The overall area occupation is also reduced with benefits in terms of die size and cost.

In regards to the DVC array for high frequency communications, the invention targets several shortcomings of existing solutions for providing a digitally controlled variable capacitor to be used in high frequency communications. Here is a list of issues which are known to the industry as of today: application specific capacitance range (minimum and maximum capacitance) and step size (interval between two consecutive capacitance values) are difficult to obtain from existing solutions; as consequence the application circuit design is sub-optimal as it needs to adjust to the capacitor range and step size; high power handling and ability of changing capacitance value with power applied is still difficult to achieve with existing technologies; and process variability typical of solid state technology and micro-electro-mechanical systems results in wide tolerance intervals for the specified capacitance values of the variable capacitor, making the overall application circuit design sub-optimal.

One existing solutions is based on a limited number of fixed capacitors being switched in or out of the application circuit by means of integrated switches. Another existing implementation is based on micro-electro-mechanical (MEMS) devices, usually in limited numbers all integrated on a common substrate, which implement variable capacitors controlled by a CMOS circuitry.

One embodiment here disclosed reports an implementation of a digital variable capacitor based on a large number of small MEMS devices, each implementing a 2-value variable capacitor. The number of such MEMS devices ranges from 100 to several 1000's depending on the target overall specification of the digital variable capacitor. These small MEMS devices are grouped in certain number of cells and this grouping can be performed in different ways according to target specifications. Within each cells, MEMS switches can be either of the same size or different sizes, also allowing targeting specific performance parameters. The control signals are routed to the different cells in alternative ways, allowing defining step size and also providing tools for compensation of process variabilities.

One important specification for digital variable capacitors for radio frequency communications is the maximum RF power applied at which the device will still be able to switch between two capacitance values. This parameter is quantified in the hot switch voltage (VHS), equal to the maximum DC or rms equivalent ac voltage that can be applied to the RF electrode while still maintaining the digital variable capacitor ability to change state.

For the MEMS device to be able to change from maximum to minimum capacitance, the mechanical restoring force of the suspended bridge must be larger than the electrostatic force generated by the rms voltage at the RF electrode. The wider the RF electrode, the larger this force will be for a given RF power. Therefore, there is a trade-off between size of the MEMS device and hot switch voltage, with large devices having lower VHS.

Figure 22:
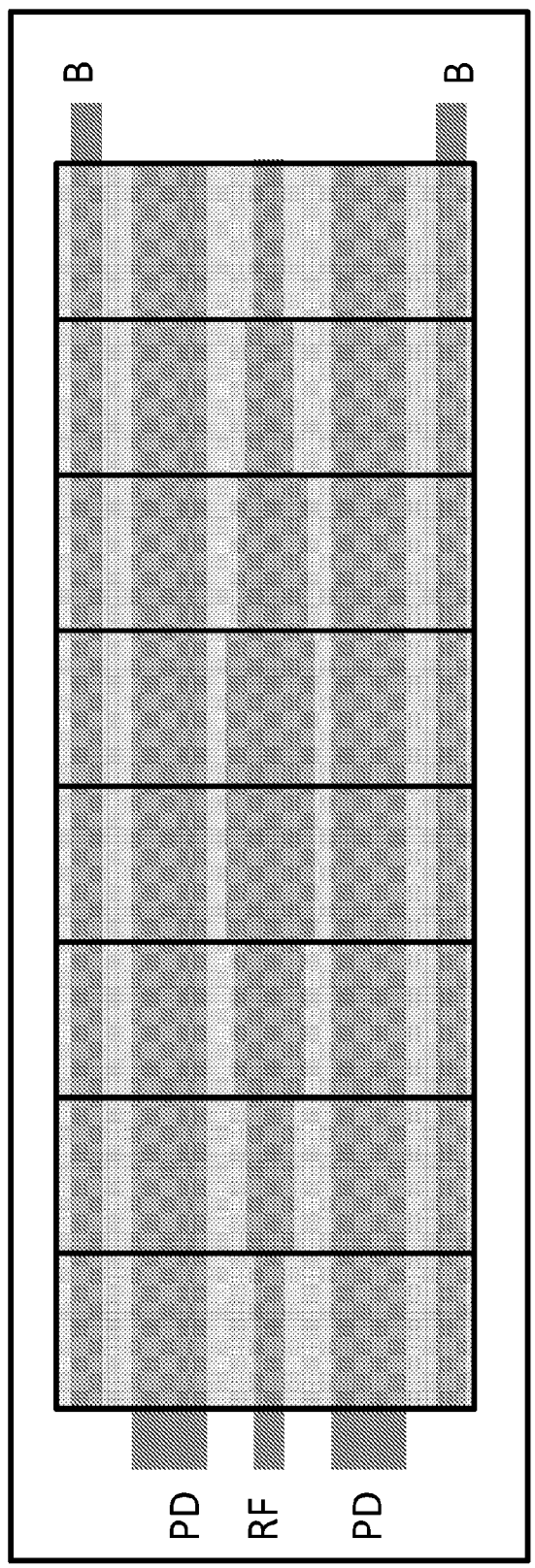
FIGS. 22 and 23 are schematic illustration of cells comprising eight MEMS devices.

FIG. 22 shows a cell with a scaled RF electrode approach. The MEMS devices are intended to be linked together so that all suspended moveable plates are joined. The advantage of this solution is to increase the hot switch voltage by maintaining a large total capacitance per cell. The smaller sized MEMS devices, corresponding to the narrow RF line sections, will start to release from the down position even if the RF rms voltage is large enough to hold the center (larger) devices down. As the edge devices release, they generate extra restoring force on the neighbor device helping them to release. The whole row of devices will unzip from edge to center resulting in a larger effective hot switch performance compared to an equivalent solution based on a constant MEMS device size (FIG. 15). In FIG. 22, the RF electrode has multiple, non-tapered widths corresponding to different MEMS devices.

Figure 23:
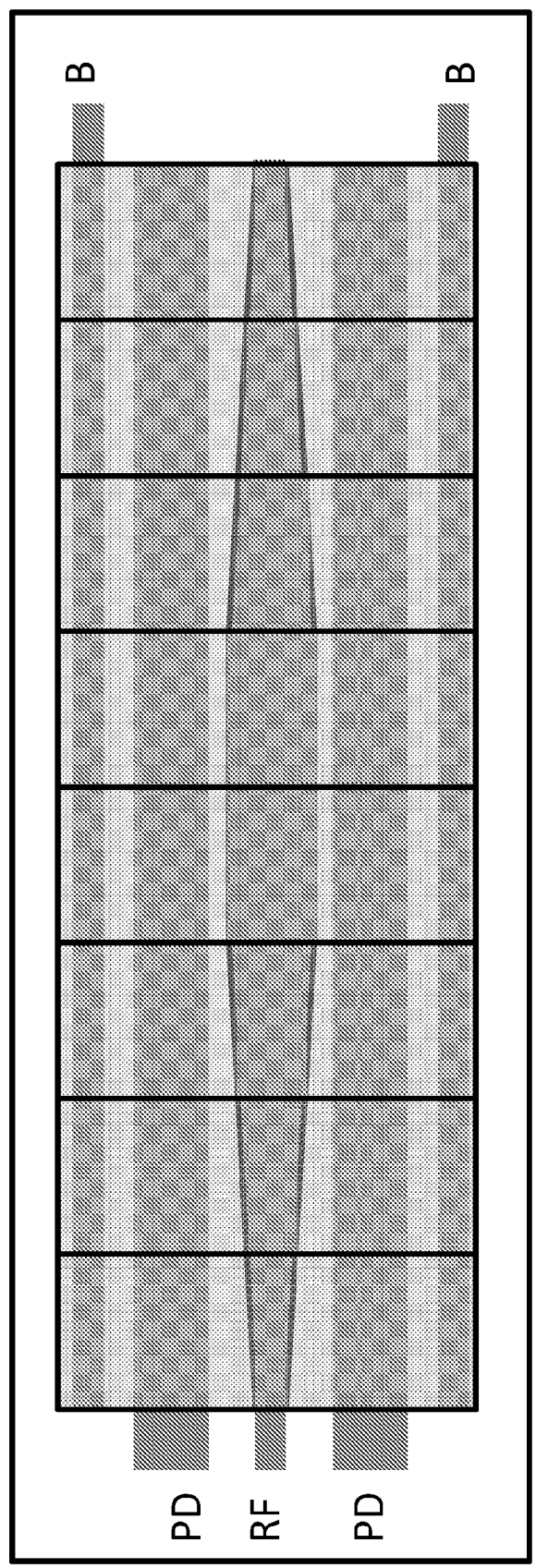

The same approach can be implemented by having a tapered RF electrode as shown in FIG. 23. The full digital variable capacitor is implemented by grouping a certain number of cells around one or more pads which provide the connection to the application circuit board. By performing such arrangement, the number and size of the cells will be designed together with the CMOS control in order to achieve the required step size resolution for the digital capacitor.

Figure 24:
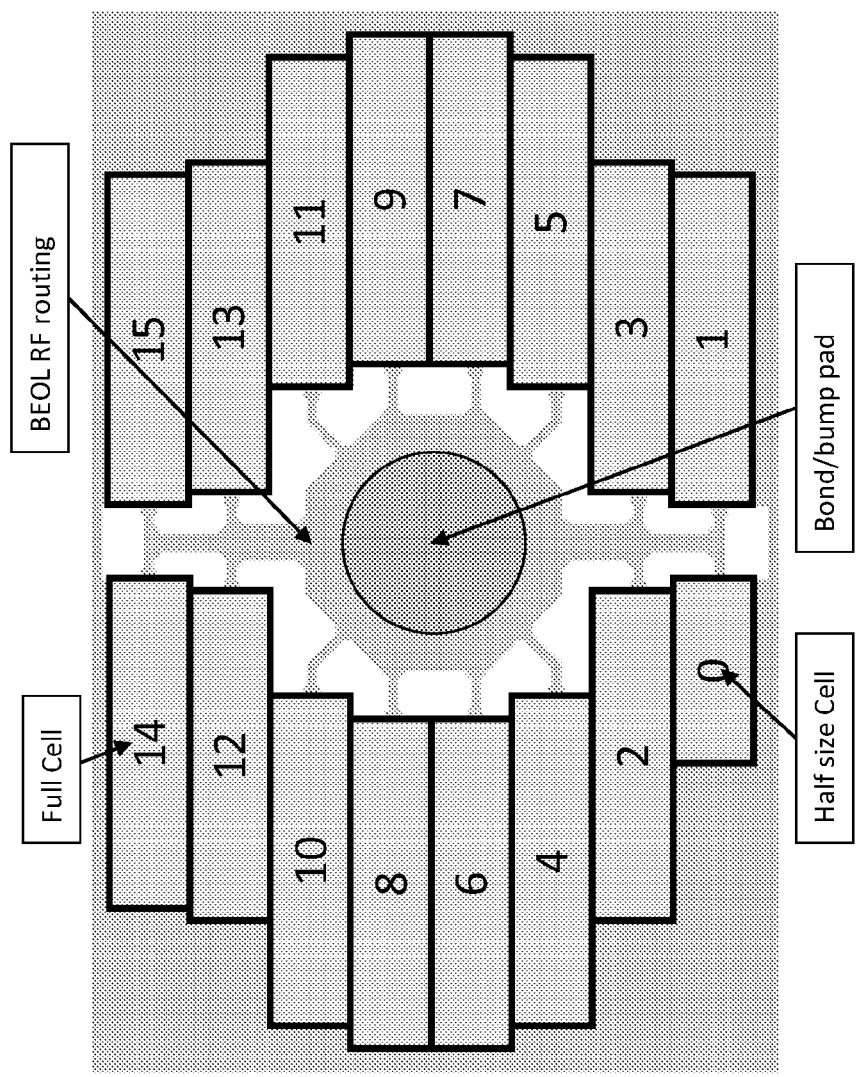
FIG. 24 is schematic illustration of a DVC according to one embodiment.

One example of such an arrangement is shown in FIG. 24. In this implementation there are 15 equal size cells (numbered 1 to 15) and one half-size cell (numbered 0). The half size cell defined the smallest capacitance change that can be implemented; in other terms the least significant bit (LSB) size. The remaining 15 cells can be controlled by the CMOS in order to provide always equal step size between two consecutive control states. One embodiment of this grouping is a binary weighted approach, where cells are grouped following a power of 2 scaling in order to generate as many cell groups as number of bits in the control. One implementation of binary weighted grouping has a given cell assigned statically to a given bit. For example: bit0: cell 0; bit1: cell 1; bit2: cells 2 and 3; bit3: cells 4, 5, 6 and 7; bit4: cells 8, 9, 10, 11, 12, 13, 14 and 15. Another implementation of binary weighted grouping is dynamically assigning cells to bits in order to improve life time, depending on the usage conditions.

Figure 25:
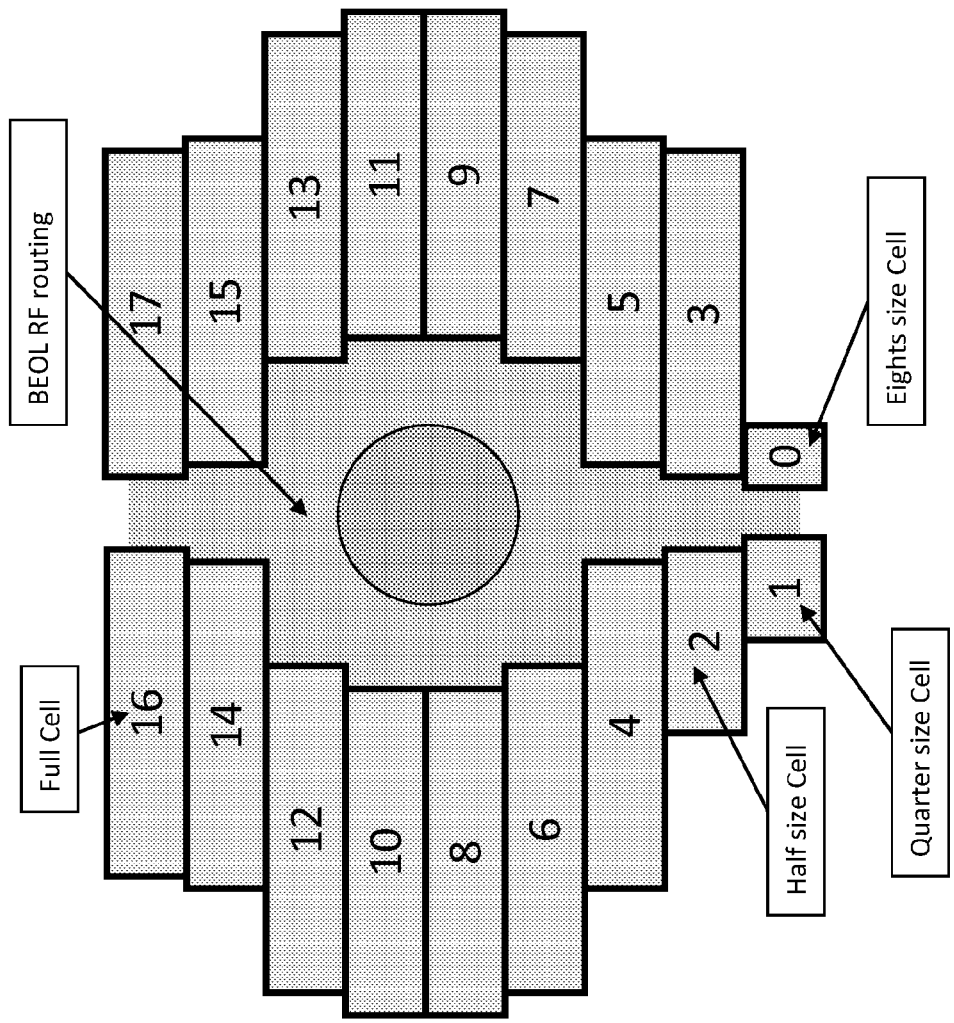
FIG. 25 is a schematic illustration of a DVC according to another embodiment.

In FIG. 25 a different arrangement is designed to achieve a smaller LSB size. Here the smallest capacitance change is given by a cell which is $\frac{1}{8}^{th}$ of the full cell size. With this implementation a much finer resolution of the digital variable capacitor is obtained. One implementation of the control would give 7 bits with the following assignment: bit0: cell 0; bit1: cell 1; bit2: cell2; bit3: cell 3; bit4: cells 4 and 5; bit5: cells 6, 7, 8 and 9; bit6: cells 10, 11, 12, 13, 14, 15, 16 and 17.

Another alternative use of these small cells is compensation of process variability and calibration. In one implementation, the previously discussed digital variable capacitor is a 5 bit resolution. This is implemented with the following assignments: bit0: cell2; bit1: cell 3; bit2: cells 4 and 5; bit3: cells 6, 7, 8 and 9; bit4: cells 10, 11, 12, 13, 14, 15, 16 and 17. The remaining smaller sized cells 0 and 1 can be set to a pre-defined state, or their pre-defined state can be programmed into the CMOS control, so that the minimum and maximum capacitance of the digital capacitor meets specific requirements which are beyond the technology capability due to process variabilities.

Figure 26:
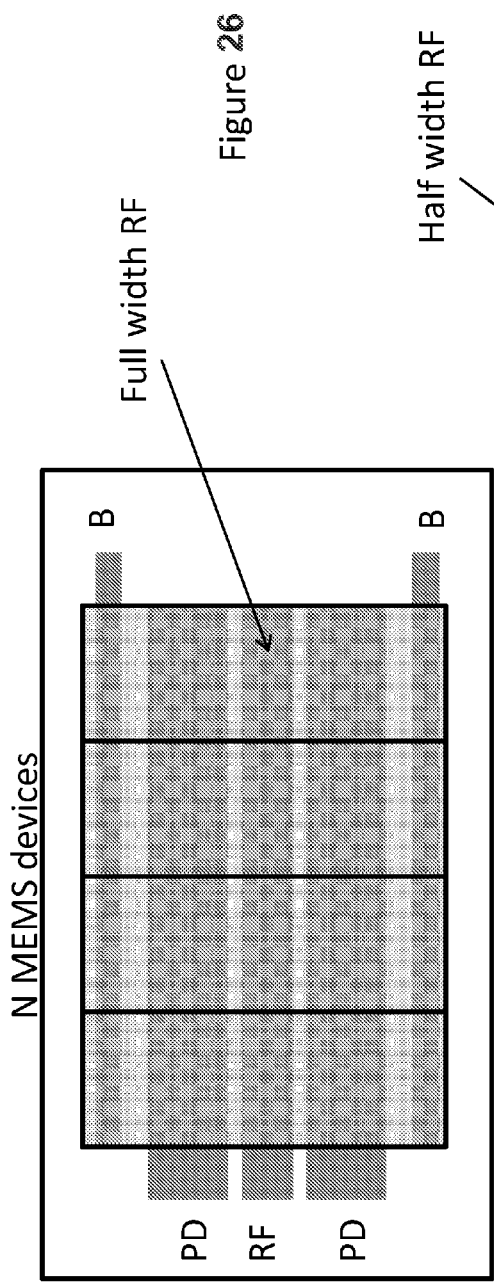
FIGS. 26 and 27 are a schematic illustrations of cells having MEMS devices according to other embodiments.
Figure 27:
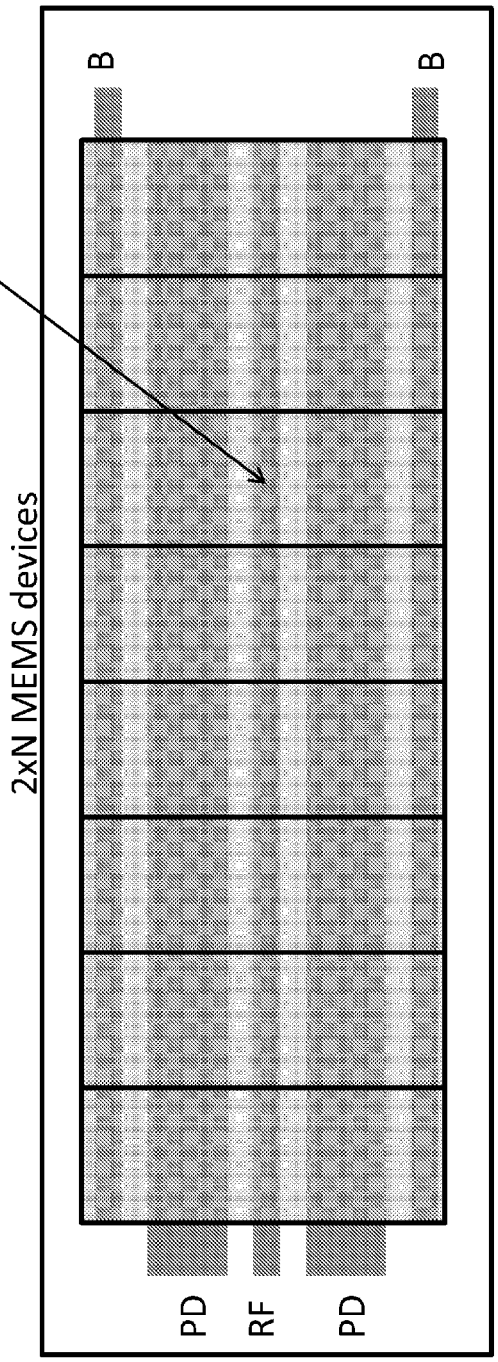

For very small resolution, the LSB cell can result in relatively small number of MEMS devices. This can have negative effects on the yield. In FIGS. 26 and 27, an alternative way of performing scaling of cell size is shown. FIG. 26 is made of N MEMS devices of a given size Cmems. FIG. 27 is made of 2×N MEMS devices of half size due to the RF electrode being half the width. This important flexibility will improve overall yield in high resolution digital variable capacitor solutions.

Figure 28:
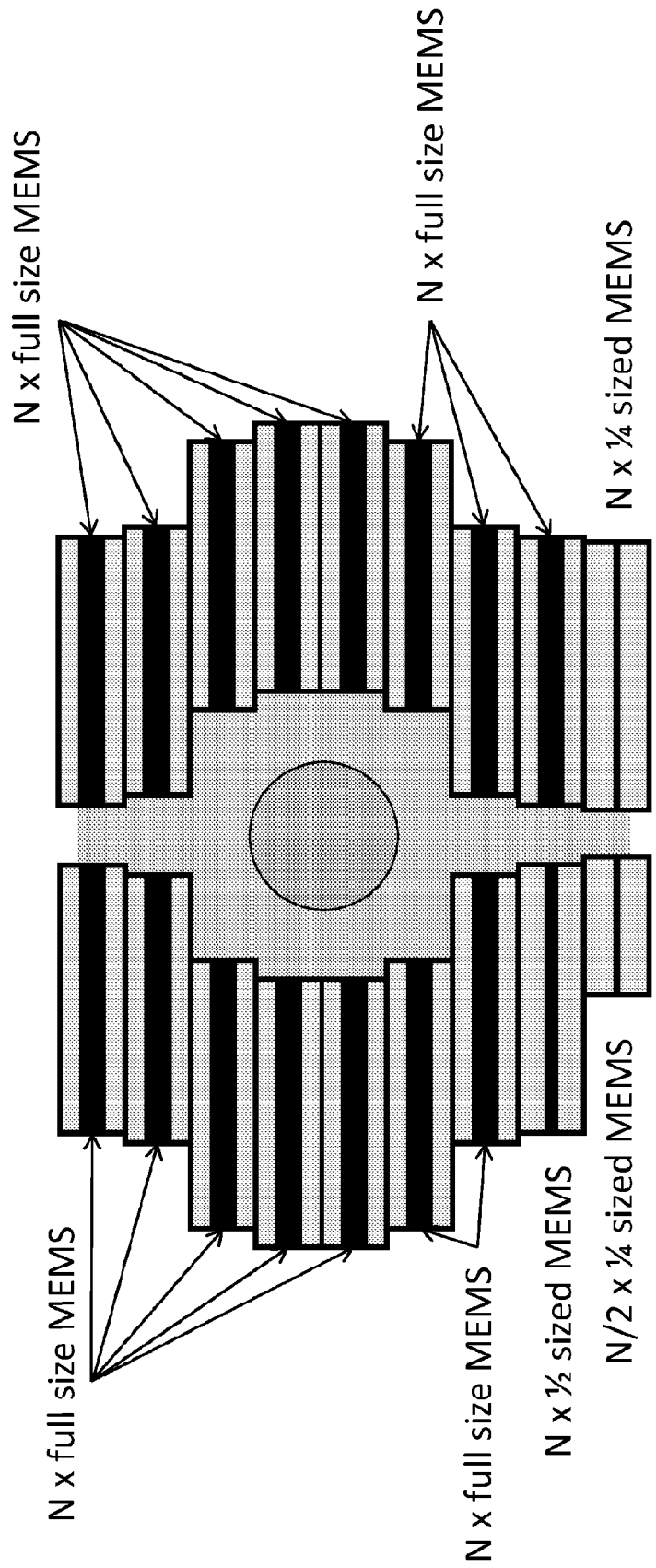
FIG. 28 is a schematic illustration of a DVC according to another embodiment.

A further level of flexibility consists in designing digital variable capacitors with different bits consisting of different size MEMS devices. A possible implementation is shown in FIG. 28. In one implementation this approach can be used to improve hot switch capability of the digital capacitor in the conditions of maximum rms voltage applied at the RF electrode. As an example implementation, the digital capacitor is connected in shunt configuration across a transmission line which connects a source to a load. In this condition, for any given available power from the source, the rms voltage at the RF electrode is larger when the capacitance value is small. Therefore, the worse case hot switch scenario is given by having to release the smallest bits (LSB, LSB-1 or LSB-2) when all other bits are already at minimum capacitance state. By implementing those bits using cells made of smaller MEMS devices, the hot switch capability will be better when needed.

Another implementation of the same concept relies on the CMOS to add cleverness in dealing with the hot switch requirements. The MEMS design is unchanged across the full array, giving a stable target for optimizing process parameters for yield. The size of the RF electrode within the MEMS area is modified for different cells, together with the restoring force tied to the legs/suspension design. Each cell can potentially target a different maximum hot switching RF RMS voltage. A control scheme will take care of hot-switching the right group of cells according to the value of the total capacitance, which is inversely proportional to the expected worse case RMS voltage across the RF capacitor plates. A First In First Out (FIFO) control scheme is an example approach, where the high voltage cells are the first ones to be switched to high capacitance when total capacitance must be increased, while being the last ones to be switched back to low capacitance when total capacitance must be reduced.

Figure 29:
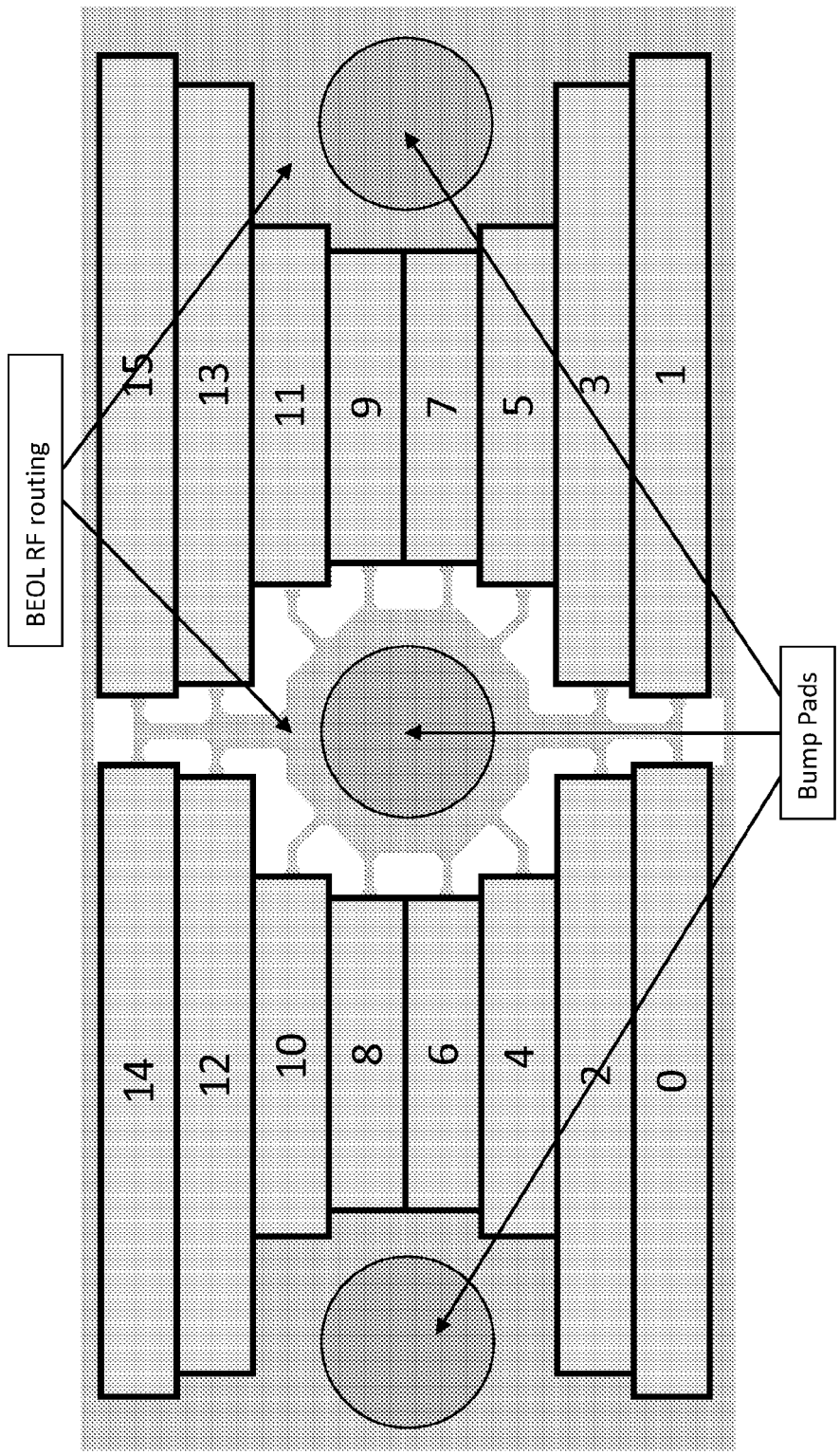
FIG. 29 is a schematic illustration of a DVC according to another embodiment.

In FIG. 29 is a schematic view of a digital capacitor implementation that takes advantage of the flexible cell size design in order to maximize area usage and generate the large maximum capacitance for a given MEMS device design. Here the pitch between connection (bump) pads is defined by product requirements and cannot be increased. The cell size will then be smaller for the cells that are constrained in-between two bumps, such as cell numbers 4, 5, 6, 7, 8, 9, 10 and 11. But other cells can extends at either sides of the bump pads in order to increase the total capacitance size, such as in cells 0, 1, 2, 3, 12, 13, 14 and 15. Appropriate cells size design, also using slightly different MEMS device size if needed, and control strategy by cells grouping in bits and CMOS design will ensure a uniform step size of the digital capacitor.

Another way to take advantage of flexibility of cell size design is for implementing special step size strategies that go beyond the standard uniform equally spaced values. One example is having a coarse step size together with fine step size. This can be easily implemented by having some cells providing the required large steps while smaller sized cells providing fine step sizes. Properly designed coding scheme in the CMOS will allow to either quickly "jump" to the desired coarse value or finely adjust capacitance around that value.

While the foregoing is directed to embodiments of the present invention, other and further embodiments of the invention may be devised without departing from the basic scope thereof, and the scope thereof is determined by the claims that follow.

The invention claimed is:

1. A semiconductor device, comprising:
a substrate;
one or more cells disposed over the substrate;
one or more MEMS devices disposed in each cell; and
one or more resistors disposed between the substrate and the one or more cells, wherein each cell further comprises one or more of a pull-down electrode and a pull-up electrode, wherein the one or more resistors are electrically coupled to one or more of the pull-down electrode and the pull-up electrode, further comprising an RF electrode disposed within each cell, wherein each MEMS device comprises a switching element movable from a first position spaced a first distance from the RF electrode and a second position spaced a second distance from the RF electrode that is different than the first distance.

2. The semiconductor device of claim 1, wherein the RF electrode of at least one cell is tapered from a center of cell to an edge of the cell.

3. A semiconductor device, comprising:
a substrate;
one or more cells disposed over the substrate;
one or more MEMS devices disposed in each cell; and
one or more resistors disposed between the substrate and the one or more cells, wherein each cell comprises a pull-down electrode and a pull-up electrode and wherein a first resistor is coupled to the pull-down electrode and a second resistor is coupled to the pull-up electrode.

4. The semiconductor device of claim 3, wherein each cell comprises an RF electrode.

5. The semiconductor device of claim 4, wherein a first cell comprises a first RF electrode having a first size and wherein a second cell comprises a second RF electrode having a second size different than the first size.

6. The semiconductor device of claim 5, wherein the first cell has a first number of MEMS devices and the second cell has a second number of MEMS device that is different than the first number of MEMS devices.

7. A semiconductor device, comprising:
a substrate;
one or more cells disposed over the substrate;
one or more MEMS devices disposed in each cell; and
one or more resistors disposed between the substrate and the one or more cells, wherein each cell comprises an RF electrode.

8. The semiconductor device of claim 7, wherein each cell further comprises one or more of a pull-down electrode and a pull-up electrode.

9. The semiconductor device of claim 8, wherein the one or more resistors are electrically coupled to one or more of the pull-down electrode and the pull-up electrode.

10. The semiconductor device of claim 7, wherein a first cell comprises a first RF electrode having a first size and wherein a second cell comprises a second RF electrode having a second size different than the first size.

11. The semiconductor device of claim 10, wherein the first cell has a first number of MEMS devices and the second cell has a second number of MEMS device that is different than the first number of MEMS devices.

12. A semiconductor device, comprising:
a substrate;
one or more cells disposed over the substrate;
one or more MEMS devices disposed in each cell; and
one or more resistors disposed between the substrate and the one or more cells, further comprising an RF electrode disposed within each cell, wherein each MEMS device comprises a switching element movable from a first position spaced a first distance from the RF electrode and a second position spaced a second distance from the RF electrode that is different than the first distance.

13. The semiconductor device of claim 12, wherein the RF electrode of at least one cell is tapered from a center of cell to an edge of the cell.

14. The semiconductor device of claim 12, wherein the RF electrode of at least one cell has two or more different widths corresponding to two or more different MEMS devices.

15. A semiconductor device, comprising:
   a substrate;
   one or more cells disposed over the substrate;
   one or more MEMS devices disposed in each cell; and
   one or more resistors disposed between the substrate and the one or more cells, wherein the one or more resistors comprises a poly-resistor.

16. A semiconductor device, comprising:
   a substrate;
   one or more cells disposed over the substrate;
   one or more MEMS devices disposed in each cell; and
   one or more resistors disposed between the substrate and the one or more cells, further comprising one or more metallization layers disposed between the substrate and the one or more cells.

17. A method of operating a semiconductor device, comprising:
   controlling a plurality of cells disposed over a CMOS structure, each cell having a plurality of MEMS devices therein and an RF electrode, a first cell of the plurality of cells has a first RF electrode having a first width and a first capacitance, and a second cell of the plurality of cells having a second RF electrode having a second width different than the first width and a second capacitance different than the first capacitance, wherein controlling sequentially comprises:
      moving switches present in the first cell to increase a total capacitance of the semiconductor device;
      moving switches present in the second cell to increase the total capacitance of the semiconductor device;
      moving the switches present in the second cell to decrease the total capacitance of the semiconductor device; and
      moving the switches present in the first cell to decrease the total capacitance of the semiconductor device.

18. A method of calibrating a semiconductor device, comprising:
   assigning first bit values to a first plurality of cells of the semiconductor device, each cell comprising a plurality of MEMS devices and an RF electrode; and
   assigning second bit values to one or more second cells of the semiconductor device, wherein the second bit values are different from the first bit values and the one or more second cells are each smaller in size than the first plurality of cells.

19. The method of claim 18, further comprising causing the MEMS devices of at least one cell of the first plurality of cells to move.

20. The method of claim 18, further comprising:
   sensing a total capacitance value for the semiconductor device;
   causing the MEMS devices of at least one cell of the first plurality of cells to move, wherein the moving occurs based upon a predefined frequency.

* * * * *

UNITED STATES PATENT AND TRADEMARK OFFICE
CERTIFICATE OF CORRECTION

Page 1 of 1

PATENT NO. : 9,076,808 B2
APPLICATION NO. : 14/240677
DATED : July 7, 2015
INVENTOR(S) : Gaddi et al.

It is certified that error appears in the above-identified patent and that said Letters Patent is hereby corrected as shown below:

In the Specification

In Detailed Description:

Column 6, Line 7, please delete "10" and insert --IO-- therefor.

Signed and Sealed this
Twenty-ninth Day of December, 2015

Michelle K. Lee
*Director of the United States Patent and Trademark Office*